Figure 1:
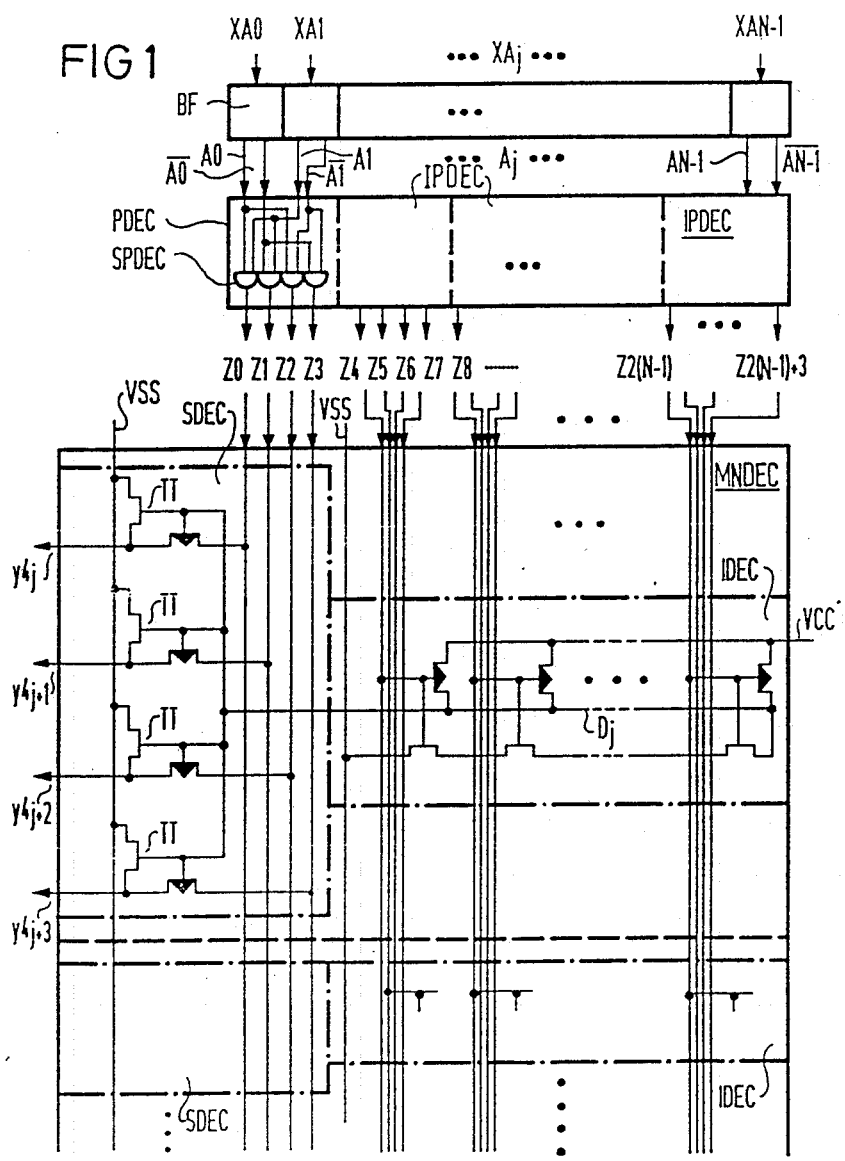

United States Patent [19]

Hoffmann et al.

[11] Patent Number: 4,906,994
[45] Date of Patent: Mar. 6, 1990

[54] MULTI-STAGE INTEGRATED DECODER DEVICE

[75] Inventors: Kurt Hoffmann, Taufkirchen; Rainer Kraus, Munich; Oskar Kowarik, Grafing; Manfred Paul, Unterfoehring, all of Fed. Rep. of Germany

[73] Assignee: Siemens Aktiengesellschaft, Munich, Fed. Rep. of Germany

[21] Appl. No.: 168,652

[22] Filed: Mar. 16, 1988

[30] Foreign Application Priority Data

Mar. 16, 1987 [DE] Fed. Rep. of Germany ....... 3708523
Mar. 16, 1987 [DE] Fed. Rep. of Germany ....... 3708525

[51] Int. Cl.$^4$ ............................................ H03M 7/38
[52] U.S. Cl. ...................................... 341/51; 341/56; 375/17
[58] Field of Search ...................... 341/51, 56, 78, 88, 341/101; 360/47; 375/17

[56] References Cited

U.S. PATENT DOCUMENTS 3,925,780 12/1975 Van Voorhis ......................... 341/78
4,118,791 10/1978 Swain ................................... 341/56
4,177,455 12/1979 Armstrong et al. .................. 341/78

FOREIGN PATENT DOCUMENTS 0115187 8/1984 European Pat. Off. .
0117903 9/1984 European Pat. Off. .

OTHER PUBLICATIONS

IEEE Journal of Solid-State Circuits, vol. SC-18, No. 5, Oct. 1983, pp. 457 to 462 "A 70 ns High Density 64K CMOS Dynamic RAM".
1986 IEEE International Solid State Circuits Conference, pp. 260-261 and 365; "A 47 ns 64KW×4b CMOS DRAM with Relaxed Timing Requirements".
The 10th International Symposium on Fault-Tolerant Computing; pp. 131-136; "FITPLA: A Programmable Logig Array for Function Independent Testing".
IBM Technical Disclosure Bulletin, vol 27, No. 4B, Sep. 1984; pp. 2439-2441; W. W. Proebster et al., "High-Speed Chip Card Reading".

Primary Examiner—William M. Shoop, Jr.
Assistant Examiner—Gary J. Romano
Attorney, Agent, or Firm—Herbert L. Lerner; Laurence A. Greenberg

[57] ABSTRACT

A multi-stage integrated decoder device has a special function which facilitates the simultaneous activation of a plurality and as many as all of its outputs. When it is used as a bit line decoder it is thus possible to activate a plurality and as many as all of the bit lines (including any redundant bit lines) of a block of storage cells of a semiconductor memory.

7 Claims, 6 Drawing Sheets

MULTI-STAGE INTEGRATED DECODER DEVICE

The invention relates to a multi-stage, integrated decoder device including at least a preliminary decoder device with a selection preliminary decoder and internal preliminary decoder units, the selection preliminary decoder and each internal preliminary decoder unit being in the form of one-from-n decoders, and a man decoder device having a plurality of selection decoders and internal decoders.

A device of the type mentioned above is disclosed in the following publications:

(a) IEEE JOURNAL OF SOLID-STATE CIRCUITS, VOL. SC-18, NO. 5, Oct. 1983, pages 457 to 462 "A 70 ns High Density 64K CMOS Dynamic RAM"; and (b) 1986 IEEE International Solid-State Circuits Conference, pages 260 to 261 and 365; "A 47 ns 64KW ×4b CMOS DRAM with relaxed Timing Requirements".

Both publications disclose devices of the type mentioned above in association with integrated semiconductor memories. As in the case of the present invention, they can be used both as word and bit line decoders. They fundamentally contain (at least by way of suggestion) three types of sub-circuits: preliminary decoders, main decoders and follow-up decoders. The present invention is based on components which relate to preliminary and main decoders. As will be apparent to all those skilled in the art, the invention can of course be combined with follow-up decoders in accordance with the above-mentioned publications.

It is accordingly an object of the invention to provide a multi-stage integrated decoder device, which overcomes the hereinafore-mentioned disadvantages of the heretofore-known devices of this general type and which has the simplest possible structure so that, depending upon the application, it permits more than one word line or bit line, such as a block of storage cells of a semiconductor memory, to respond simultaneously, i.e. in parallel with one another.

With the foregoing and other objects in view there is provided, in accordance with the invention, a multi-stage, integrated decoder device, comprising: a preliminary decoder device having a selection preliminary decoder and internal preliminary decoder units each being in the form of one-from-n decoders, the internal preliminary decoder units including outputs supplying output signals; means for supplying a test-enable signal to each of the internal preliminary decoder units deactivating all of the output signals of all of the internal preliminary decoder units; a main decoder device receiving output signals from the preliminary decoder device and having a plurality of selection decoders and internal decoders, the selection decoders having outputs and transfer transistors with source terminals; and first and second potential lines each having one of two mutually-complementary logic levels independently of one another; a first half of the outputs of each of the selection decoders each being connected through the source terminals of a respective one of the transfer transistors to the first potential line, and a second half of the outputs of each of the selection decoders each being connected through the source terminals of a respective one of the transfer transistors to the second potential line.

In accordance with another feature of the invention, each of the internal preliminary decoder units includes $2^n$ logic gates provided with outputs and n inputs for an n address signal and a complementary address signal, the supplying means are in the form of a further input for the test-enable signal, and the test-enable signal deactivates the output of each gate independently of the signal combination currently occurring at the remaining n inputs.

In accordance with a further feature of the invention, there are provided means for applying test signals having logic levels which can be set independently of one another to the potential lines.

In accordance with an added feature of the invention, the applying means are in the form of CMOS-inverters with outputs issuing the test signals as output signals, inputs receiving respective test-auxiliary signals and sources connected between a supply potential and a reference potential.

With the objects of the invention in view, there is also provided a multi-stage, integrated decoder device, comprising: a preliminary decoder device having a selection preliminary decoder and internal preliminary decoder units each being in the form of one-from-n decoders, the internal preliminary decoder units including outputs supplying output signals; means for supplying a test-enable signal to each of the internal preliminary decoder units deactivating all of the output signals of all of the internal preliminary decoder units; a main decoder device receiving output signals from the preliminary decoder device and having a plurality of selection decoders and internal decoders, the selection decoders having outputs and transfer transistors with source terminals; and a plurality of potential lines each having one of two mutually-complementary logic levels independently of one another; at least one group and as many as all of the outputs of each of the selection decoders each being connected through the source terminals of a respective one of the transfer transistors to one of the potential lines.

With the objects of the invention in view, there is furthermore provided a multi-stage, integrated decoder device, comprising: a preliminary decoder device having a selection preliminary decoder and internal preliminary decoder units each being in the form of one-from-n decoders, the internal preliminary decoder units including outputs supplying output signals; means for supplying a test-enable signal to each of the internal preliminary decoder units deactivating all of the output signals of all of the internal preliminary decoder units; a main decoder device receiving output signals from the preliminary decoder device and having a plurality of selection decoders and internal decoders, the selection decoders having outputs and transfer transistors with source terminals; and a potential line having one of two mutually-complementary logic levels; each of the outputs of each of the selection decoders being connected through the source terminal of a respective one of the transfer transistors to the potential line.

In this context it should be expressly noted that the present invention can also be combined with the advantageous decoder device corresponding to co-pending U.S. Application Serial No. 168,672 which has the same filing date as the instant application. These inventions can be applied particularly well in combination with the devices disclosed in co-pending U.S. Applications Serial Nos. 168,668; 168,676; 168,667 and 168,653 which also have the same filing date as the instant application.

Other features which are considered as characteristic for the invention are set forth in the appended claims.

Although the invention is illustrated and described herein as embodied in a multi-stage integrated decoder device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block circuit diagram of a decoder device according to the prior art; and FIGS. 2 to 6 are schematic and block circuit diagrams of advantageous embodiments of a decoder device according to the present invention.

Referring now to the figures of the drawings in detail and first, particularly, to FIG. 1 thereof, there is seen a decoder device corresponding to the prior art. The mode of functioning of the decoder device shown in FIG. 1 will only be briefly discussed below and will presumably be familiar to those skilled in the art.

Address-input signals XA0 to XAN-1, for example (where N is an even number), are intermediately stored in a buffer circuit BF and where appropriate (as assumed here) are forwarded to a preliminary decoder PDEC as true addresses $\overline{A0}$ to $\overline{AN-1}$ and complementary addresses A0 to AN-1. The preliminary decoder PDEC is sub-divided into a selection preliminary decoder SPDEC and, for example, (N/2)-1 internal preliminary decoders IPDEC. With a suitable value for N, (N/3)-1 or a similar number of internal preliminary decoders IPDEC could also be provided. In the case of the prior art shown in FIG. 1, the selection preliminary decoder SPDEC and the internal preliminary decoders IPDEC are all identical. Each of these is formed of a so-called 1-from-n-decoder (where in the concrete example n is equal to two mutually-independent addresses Aj).

The output of the preliminary decoder PDEC is connected to a main decoder MNDEC. The main decoder MNDEC includes a number of selection decoders SDEC and internal decoders IDEC. A respective selection decoder SDEC and internal decoder IDEC are assigned to one another functionally and electrically. While the internal coders IDEC are driven by output signals Z4... of the internal preliminary decoders IPDEC, the selection decoders SDEC are driven by output signals Z0 to Z3 of the selection preliminary decoder SPDEC. When the device is used as a bit line decoder, each output signal Y4j... of a selection decoder SDEC drives exactly one bit line, for example a bit line of a block of storage cells of a semiconductor memory, through a pair of non-illustrated transfer transistors. The outputs of each selection decoder SDEC are connected to a reference potential VSS which is switched through source terminals of transfer transistors TT.

The decoder device in accordance with the invention as shown in FIGS. 2 to 6 differs from that according to the prior art as seen FIG. 1, with respect to the following two points:

(a) Each internal preliminary decoder IPDEC (which contains $2^n$ logic gates each having n inputs for either one of n address signals $\overline{Aj}$ or a complementary address signal Aj) is supplied through a further input with a test-enable signal $\overline{TE}$ which operates with a negative logic (active low), assuming a normally positive logic (active high) in the present example. In test operation (test-enable signal $\overline{TE}$ is active), this ensures that none of the output signals Z4... of the internal preliminary decoders IPDEC assumes the value logical 1, i.e. "becomes active" (AND-gates have been shown as components of the internal preliminary decoders IPDEC, but naturally other logic functions are also possible, such as for example NOR-gates with an appropriate modification of the logic drive). Thus in each of the internal decoders IDEC a preselection line Dj provided therein safely assumes the value logical 1 which, in the usual way, corresponds to the supply potential VCC of a modern integrated circuit. Thus, however, each of a plurality of n-channel transfer transistors TT contained in the selection decoders SDEC is switched through.

(b) In the case of the prior art shown in FIG. 1, the outputs of each selection decoder SDEC are connected to a reference potential VSS which is switched through the source terminals of the transfer transistors TT. In accordance with the invention, however, the sources of a first half of the transfer transistors TT are connected to a first potential line Pot1, and those of a second half of the transfer transistors TT are connected to a second potential line Pot2. Depending upon the actuation thereof, the two potential lines Pot1, Pot2 are assigned one of two mutually-complementary levels, independently of one another. For example, in normal operation both are assigned the reference potential VSS which permits the bit line of a semiconductor memory to be driven in the usual way. In test operation in which, for example, only every second bit line is to be simultaneously activated (with parallel input and output for checkerboard test patterns and wherein the word lines could also be connected), the first potential line Pot1 is connected to the supply potential VCC of a semiconductor memory as a logic level, and the second potential line Pot2 is connected to the reference potential VSS as a logic level. In test operation the outputs of the selection decoders SDEC are also assigned corresponding levels.

Figure 2:
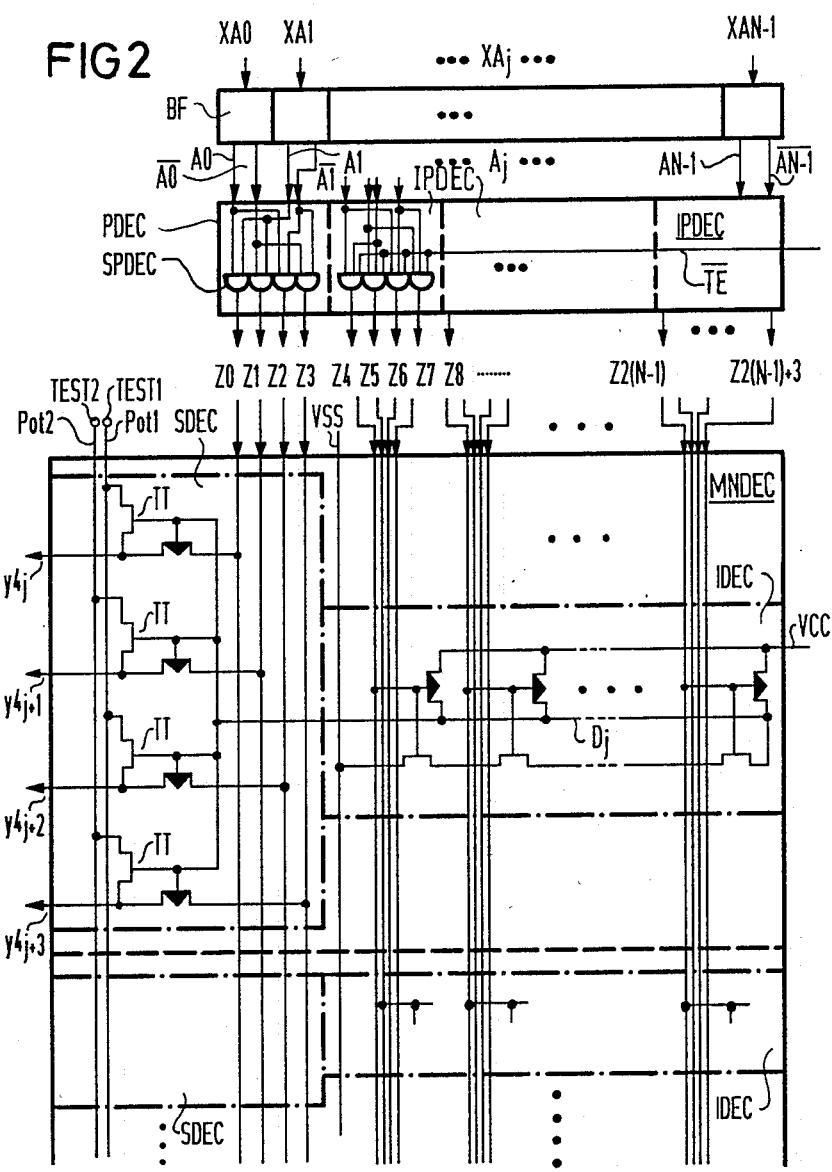

As shown in the embodiment of FIG. 2, it is advantageous for the two potential lines Pot1, Pot2 to be connected to test signals TEST1, TEST2 having logic levels which can be set independently of one another, for example to the values of the supply potential VCC and the reference potential VSS.

Figure 3:
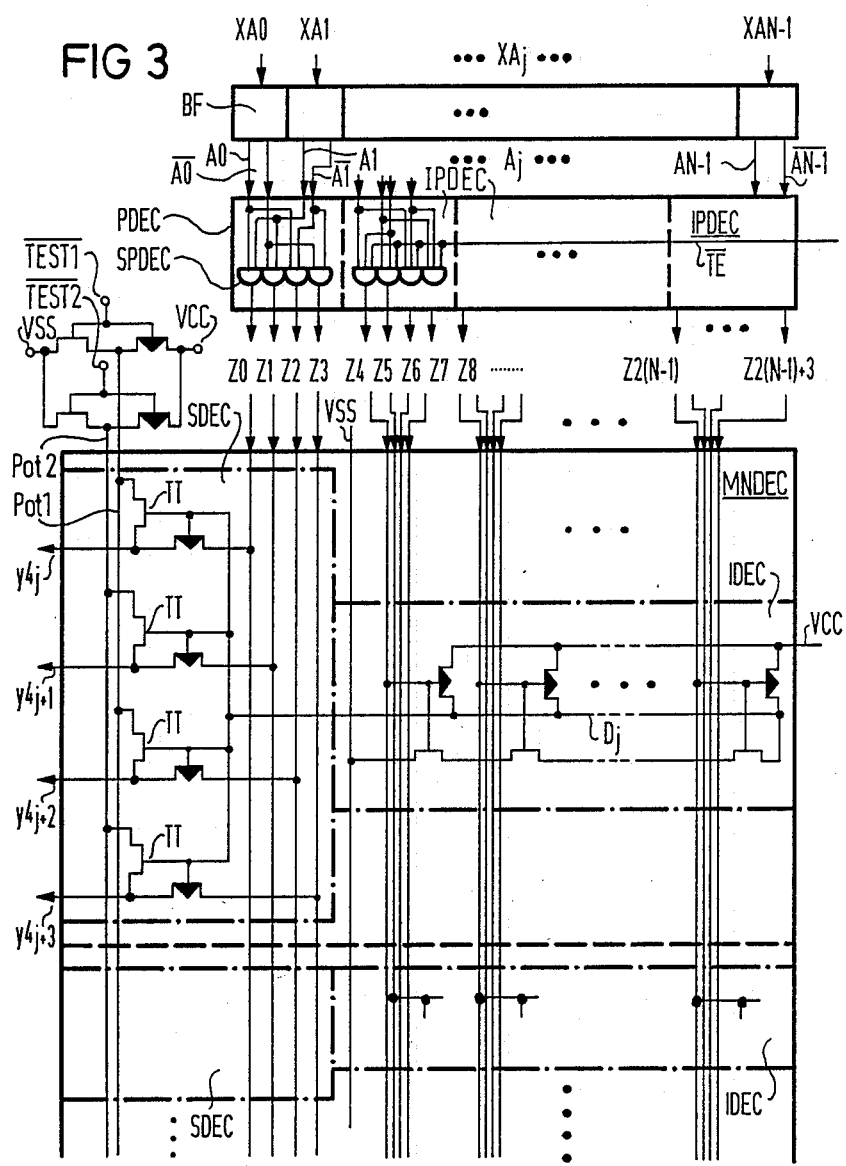

As shown in the embodiment of FIG. 3, it is also advantageous for the test signals TEST1, TEST2 to be output signals of CMOS-inverters, each of which has an input connected to respective first and second test-auxiliary signals $\overline{TEST1}$, $\overline{TEST2}$ and a source connected between the supply potential VCC and the reference potential VSS.

Figure 4:
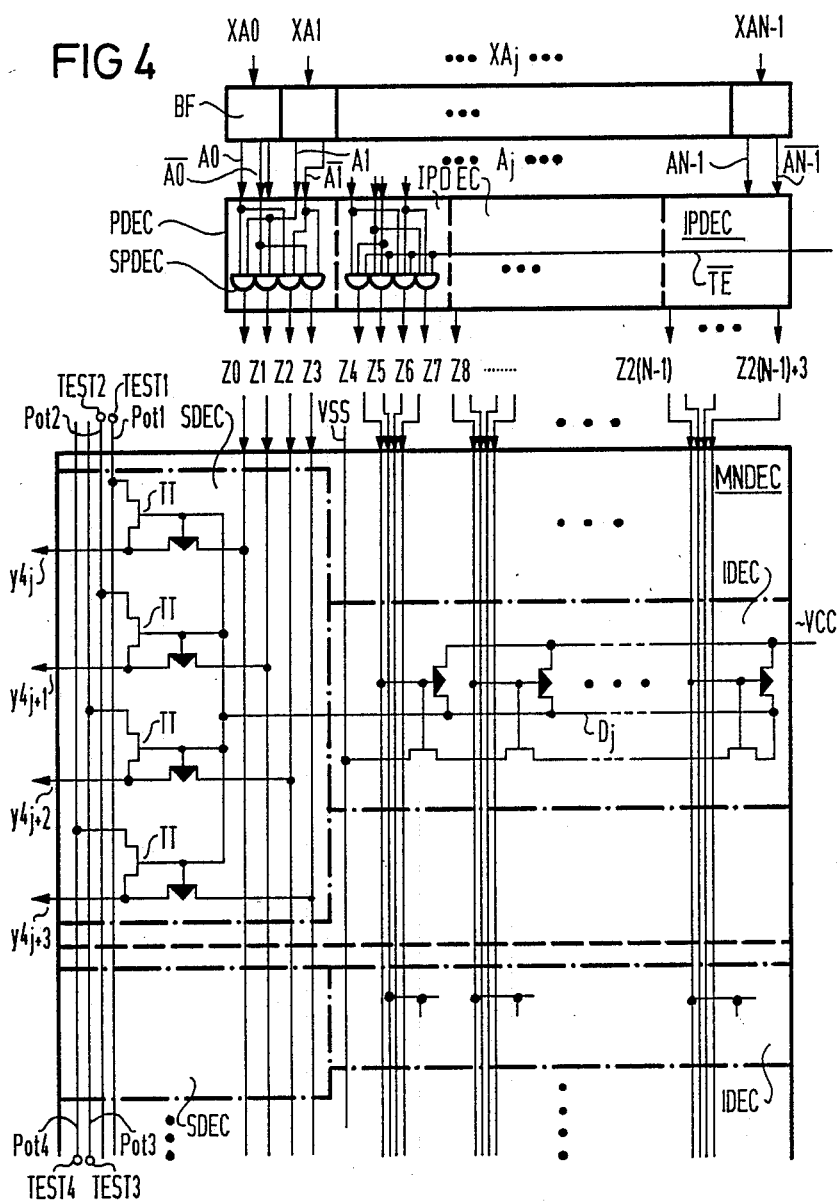

As shown in the embodiment of FIG. 4 and as expressed in general terms with respect to each selection decoder SDEC, at least one group of outputs Y4j... and a maximum of all of the outputs Y4j... is connected to a separate potential line Pot... Pot4 through the source terminal of the transfer transistor TT assigned to the respective output. Depending upon the actuation thereof, all of the potential lines Pot1 to Pot4 are assigned to one of two mutually-complementary levels, independently of one another.

The advantage of this construction is that in addition to the checkerboard test pattern ('1010'), more complicated checkerboard-like test patterns (e.g. '11001100') can also be tested, as well as quite simple test patterns such as "All 1's".

Figure 5:
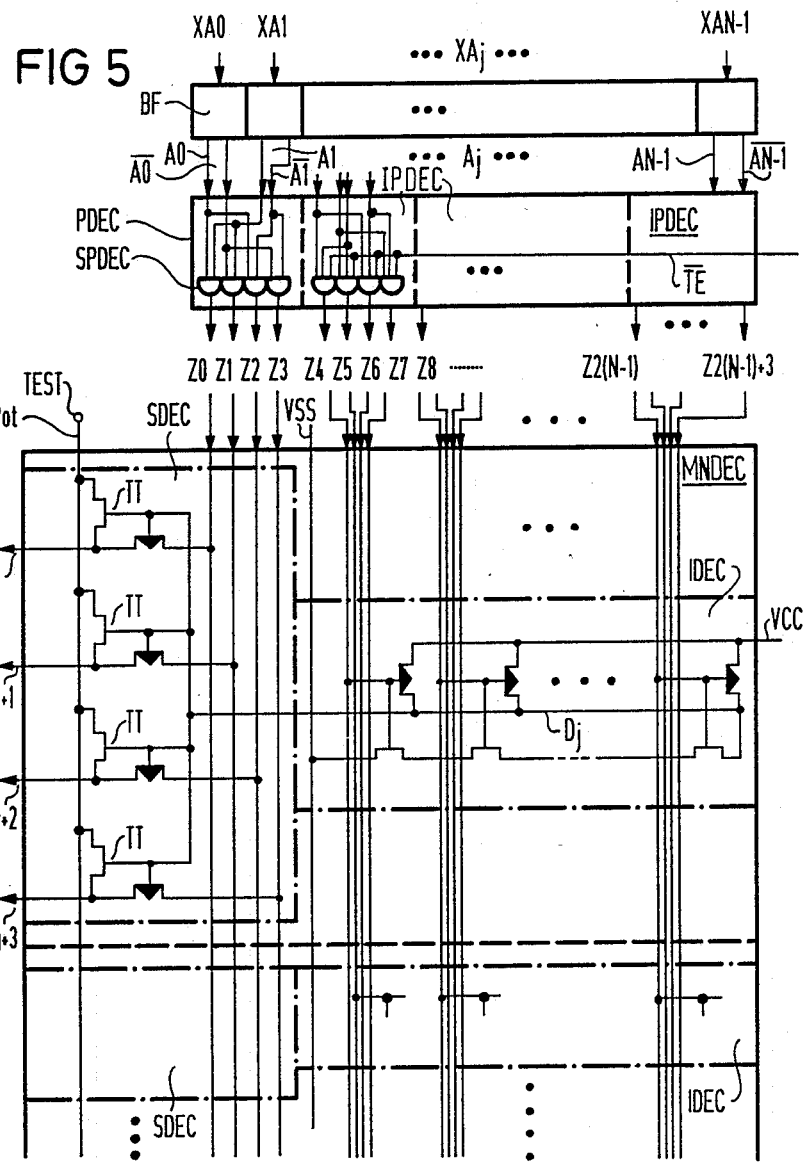
Figure 6:
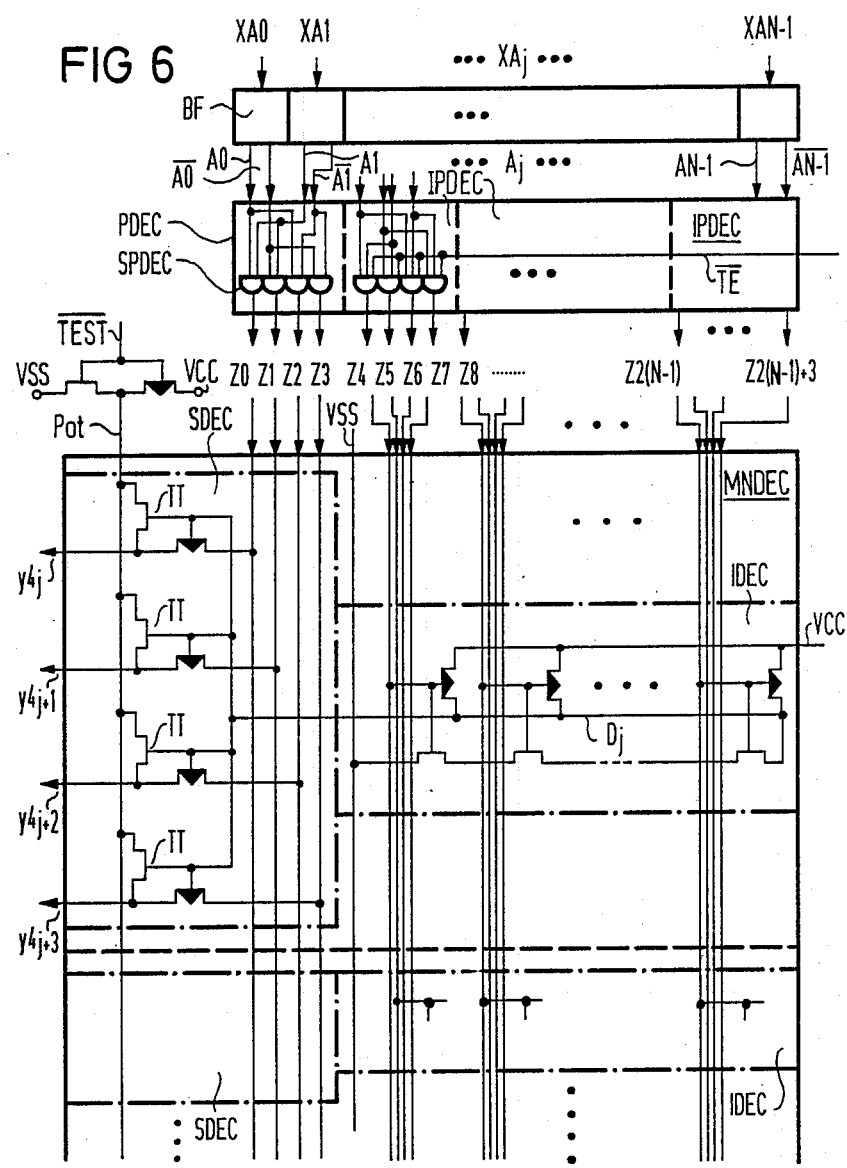

FIGS. 5 and 6 are diagrams of simplified, advantageous embodiments of the invention. In place of the minimum two potential lines Pot1, Pot2 described above, the embodiment of FIG. 5 includes only one single potential line Pot. The one potential line Pot is connected to each output Y4j, Y4j+1... of each selection decoder SDEC through the source terminal of the transfer transistor TT.

The embodiment shown in FIG. 6 combines the embodiments of FIGS. 3 and 5 and its mode of functioning will be self-explanatory to those skilled in the art in association with the above information.

Although the embodiments shown in FIGS. 5 and 6 limit the above-mentioned number of utilizable test patterns, they offer the advantage of a simpler and more space-saving construction (through the omission of at least one potential line which normally occupies a great deal of space).

When the present invention is used as a bit line decoder, an important advantage thereof resides in the additional ability to test redundancy storage cells without the need to activate the usual redundancy mechanism (e.g. through laser links which is generally irreversible). By virtue of the fact that non-illustrated separating transistors of all of the bit lines can be activated, for example, in parallel in accordance with the present invention, those of the redundancy lines are likewise activated.

What is claimed is:

1. Multi-stage, integrated decoder device, comprising:
   a preliminary decoder device having a selection preliminary decoder and internal preliminary decoder units each being in the form of one-from-n decoders, said internal preliminary decoder units including outputs supplying output signals:
   means for supplying a test-enable signal to each of said internal preliminary decoder units deactivating all of said output signals of all of said internal preliminary decoder units;
   a main decoder device receiving output signals from said preliminary decoder device and having a plurality of selection decoders and internal decoders, said selection decoders having outputs and transfer transistors with source terminals: and
   first and second potential lines each having one of two mutually-complementary logic levels independently of one another:
   a first half of said outputs of each of said selection decoders each being connected through the source terminals of a respective one of said transfer transistors to said first potential line, and a second half of said outputs of each of said selection decoders each being connected through the source terminals of a respective one of said transfer transistors to said second potential line.

2. Multi-stage, integrated decoder device according to claim 1, wheren each of said internal preliminary decoder units includes $2^n$ logic gates provided with outputs and n inputs for an n address signal and a complementary address signal, said supplying means are in the form of a further input for the test-enable signal, and said test-enable signal deactivates the output of each gate independently of the signal combination currently occurring at the remaining n inputs.

3. Multi-stage, integrated decoder device according to claim 1, including means for applying test signals having logic levels which can be set independently of one another to said potential lines.

4. Multi-stage, integrated decoder device according to claim 3, wherein said applying means are in the form of CMOS-inverters with outputs issuing the test signals as output signals, inputs receiving respective test-auxiliary signals and sources connected between a supply potential and a reference potential.

5. Multi-stage, integrated decoder device, comprising:
   a preliminary decoder device having a selection preliminary decoder and internal preliminary decoder units each being in the form of one-from-n decoders, said internal preliminary deoder units including outputs supplying output signals;
   means for supplying a test-enable signal to each of said internal preliminary decoder units deactivating all of said output signals of all of said internal preliminary decoder units;
   a main decoder device receiving output signals from said preliminary decoder device and having a plurality of selection decoders and internal decoders, said selection decoders having outputs and transfer transistors with source terminals: and
   a plurality of potential lines each having one of two mutually-complementary logic levels independently of one another;
   at least one group of said outputs of each of said selection decoders each being connected through the source terminals of a respective one of said transfer transistors to one of said potential lines.

6. Multi-stage, integrated decoder device according to claim 5, wherein said at least one group of said outputs of each of said selection decoders includes all of said outputs of each of said selection decoders.

7. Multi-stage, integrated decoder device, comprising:
   a preliminary decoder device having a selection preliminary decoder and internal preliminary decoder units each being in the form of one-from-n decoders, said internal preliminary decoder units including outputs supplying output signals:
   means for supplying a test-enable signal to each of said internal preliminary decoder units deactivating all of said output signals of all of said internal preliminary decoder units;
   a main decoder device receiving output signals from said preliminary decoder device and having a plurality of selection decoders and internal decoders, said selection decoders having outputs and transfer transistors with source terminals; and
   a potential line having one of two mutually-complementary logic levels;
   each of said outputs of each of said selection decoders being connected through the source terminal of a respective one of said transfer transistors to said potential line.

* * * * *